(12) United States Patent
Kashiyama

(10) Patent No.: US 10,790,165 B2
(45) Date of Patent: Sep. 29, 2020

(54) PUMP APPARATUS AND SUBSTRATE TREATING APPARATUS

(71) Applicant: SCREEN Holdings Co., Ltd., Kyoto (JP)

(72) Inventor: Masahito Kashiyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 71 days.

(21) Appl. No.: 15/679,631

(22) Filed: Aug. 17, 2017

(65) Prior Publication Data

US 2018/0061676 A1 Mar. 1, 2018

(30) Foreign Application Priority Data

Aug. 24, 2016 (JP) .................................. 2016-163726

(51) Int. Cl.
*H01L 21/67* (2006.01)
*F04B 43/02* (2006.01)
(Continued)

(52) U.S. Cl.
CPC .......... *H01L 21/67023* (2013.01); *F04B 9/02* (2013.01); *F04B 13/00* (2013.01); *F04B 23/06* (2013.01); *F04B 43/02* (2013.01); *F04B 43/025* (2013.01); *F04B 43/04* (2013.01); *F04B 53/14* (2013.01); *H01L 21/6708* (2013.01);
(Continued)

(58) Field of Classification Search
CPC ......... H01L 21/67017; H01L 21/67023; H01L 21/67028; H01L 21/6704; H01L 21/67051; H01L 21/67057; H01L 21/67075; H01L 21/6708; H01L 21/67086; H01L 21/6715; F04B 43/02; F04B 43/023; F04B 43/025
See application file for complete search history.

(56) References Cited

U.S. PATENT DOCUMENTS 1,893,776 A * 1/1933 Hull .................... F04B 43/0054
137/533.11
5,167,837 A * 12/1992 Snodgrass .............. B01D 29/15
210/134

(Continued)

FOREIGN PATENT DOCUMENTS

CN 105244300 A 1/2016
CN 105513998 A 4/2016
(Continued)

OTHER PUBLICATIONS

Office Action dated May 8, 2018 for corresponding Taiwan Patent Application No. 106119583.
(Continued)

*Primary Examiner* — David G Cormier
(74) *Attorney, Agent, or Firm* — Ostrolenk Faber LLP

(57) ABSTRACT

A drive mechanism deforms two diaphragms to perform alternate increase and decrease in volume of a supply chamber. At this time, the two diaphragms are provided for the single supply chamber. This leads to possibility of suction and feed out of a desired amount of liquid even with limited deformation of the diaphragms. In addition, the two diaphragms achieve suppression in deformation thereof upon suction and feed out of a desired amount of liquid. This allows selection of the diaphragms each with a short stroke, yielding suppressed stagnation and quality degradation of the liquid.

4 Claims, 9 Drawing Sheets

(51) Int. Cl.
  *F04B 9/02* (2006.01)
  *F04B 53/14* (2006.01)
  *F04B 13/00* (2006.01)
  *F04B 23/06* (2006.01)
  *F04B 43/04* (2006.01)
  *B05C 5/00* (2006.01)
  *B05C 11/10* (2006.01)

(52) U.S. Cl.
  CPC ......... *H01L 21/67253* (2013.01); *B05C 5/00* (2013.01); *B05C 11/10* (2013.01); *H01L 21/67017* (2013.01); *H01L 21/67051* (2013.01)

(56) References Cited

U.S. PATENT DOCUMENTS

| | | | |
|---|---|---|---|
| 6,183,223 B1 | 2/2001 | Yajima | 417/478 |
| 8,728,330 B2 * | 5/2014 | Takeishi | G03F 7/16 210/167.01 |
| 2007/0125797 A1 | 6/2007 | Cedrone et al. | 222/14 |
| 2007/0128047 A1 | 6/2007 | Gonnella et al. | 417/2 |
| 2008/0169230 A1* | 7/2008 | Nakagawa | B01D 19/0042 210/188 |
| 2012/0288379 A1 | 11/2012 | Laverdiere et al. | 417/53 |
| 2015/0300491 A1 | 10/2015 | Teshima et al. | |
| 2016/0001332 A1 | 1/2016 | Kim et al. | |
| 2018/0223826 A1 | 8/2018 | Jeon | |

FOREIGN PATENT DOCUMENTS

| | | |
|---|---|---|
| JP | 62-091675 A | 4/1987 |
| JP | 2003-148353 A | 5/2003 |
| JP | 2008-175143 A | 7/2008 |
| JP | 2009-521636 A | 6/2009 |
| JP | 2010-163925 | 7/2010 |
| JP | 5079516 B2 | 11/2012 |
| JP | 5366555 B2 | 12/2013 |
| KR | 10-2013-0058422 A | 6/2013 |
| KR | 10-2014-0056373 A | 5/2014 |
| KR | 20-2015-0003607 U | 10/2015 |
| KR | 10-1605140 B1 | 3/2016 |
| WO | WO 2007/086296 A1 | 8/2007 |

OTHER PUBLICATIONS

Office Action dated Feb. 15, 2019 for corresponding Chinese Patent Application No. 2017106569880.

* cited by examiner

PUMP APPARATUS AND SUBSTRATE TREATING APPARATUS

CROSS-REFERENCE TO RELATED APPLICATIONS

This application claims priority to Japanese Patent Application No. 2016-163726 filed Aug. 24, 2016 the subject matter of which is incorporated herein by reference in entirety.

BACKGROUND OF THE INVENTION

Field of the Invention

The present invention relates to a pump apparatus and a substrate treating apparatus that supplies a processing liquid to substrates such as semiconductor substrates, glass substrates for liquid crystal displays, photomask substrates, and optical disc substrates.

Description of the Related Art

The substrate treating apparatus includes a holding rotator, a nozzle, and a pump apparatus. The holding rotator holds a substrate in a substantially horizontal attitude, and rotates the held substrate. The nozzle dispenses a processing liquid to the substrate held with the holding rotator. The pump apparatus supplies the processing liquid to the nozzle.

The pump apparatus also includes an upstream pump, a filter, and a downstream pump. See, for example, Japanese Patent Unexamined Patent Publication (Translation of PCT Application) 2009-521636A, Japanese Patent 5366555A and 5079516A. The upstream pump supplies a processing liquid through a filter to the downstream pump. The downstream pump dispenses the processing liquid. The upstream and downstream pumps each include a single movable part (e.g., a piston) and a single rolling diaphragm that cooperates with the movable part.

SUMMARY OF THE INVENTION

The single movable part and the single diaphragm drive the currently-used pump apparatus. However, movement of the movable part and deformation of the diaphragm are limited. Accordingly, a sufficient volume may not be obtained for sucking and feeding out a liquid (e.g., the processing liquid). Therefore, the configuration is desirable that allows suction and feed out of a desired amount of liquid even when the movement of the movable part and the deformation of the diaphragm are limited.

Another configuration is desired that suppresses degradation in quality of the liquid to be sucked and fed out. For instance, the rolling diaphragm cooperating with the single piston has a deep folded part, achieving a long stroke. However, the liquid flowing into at a clearance of the folded part has poor flowability to stagnate. Accordingly, some stagnation liquid may solidify as foreign substances to cause degradation in quality of the liquid.

The present invention has been made regarding the state of the art noted above, and its one object is to provide a pump apparatus and a substrate treating apparatus that allow suction and feed out of a desired amount of liquid and suppressed degradation in quality of the liquid.

Solution to Problem

The present invention is constituted as stated below to achieve the above object. One aspect of the present invention provides a pump apparatus for feeding a liquid, including a single supply chamber that passes the liquid, two diaphragms attached to an inner wall of the supply chamber to partially form the inner wall of the supply chamber, and a drive mechanism that deforms the two diaphragms to perform alternate increase and decrease in volume of the supply chamber.

With the pump apparatus according to the aspect of the present invention, the drive mechanism deforms the two diaphragms to perform alternate increase and decrease in volume of the supply chamber. At this time, the two diaphragms are provided for the single supply chamber. This leads to possibility of suction and feed out of a desired amount of liquid even with the limited deformation of the diaphragms. In addition, the two diaphragms achieve suppression in deformation thereof upon suction and feed out of a desired amount of liquid. This allows selection of the diaphragms each with a short stroke, yielding suppressed stagnation and quality degradation of the liquid.

It is also preferred in the aspect of the pump apparatus that the drive mechanism performs alternate increase and decrease in volume of the supply chamber, the increase being made by deforming the two diaphragms in a first direction away from each other, and the decrease being made by deforming the two diaphragms in a second direction close to each other.

The diaphragms in the pump apparatus are each formed by a rolling diaphragm. Since the two diaphragms are provided, the deformation of the diaphragms is each suppressed upon a desired amount of liquid is sucked and fed out. Accordingly, the rolling diaphragm with a less deep folded part is selectable, leading to suppression in stagnation and quality degradation of the liquid.

Moreover, it is preferred that the two diaphragms of the pump apparatus are disposed to face each other across the supply chamber. This yields a compact configuration of the supply chamber.

Another aspect of the present invention provides a pump apparatus for feeding a liquid, including a single supply chamber that passes the liquid, a single tube attached to an inner wall of the supply chamber to partially form the inner wall of the supply chamber, and a drive mechanism that deform the tube bidirectionally to perform alternate increase and decrease in volume of the supply chamber.

With the pump apparatus according to the aspect of the present invention, the drive mechanism deforms the tube bidirectionally to perform alternate increase and decrease in volume of the supply chamber. At this time, the single tube is deformed bidirectionally. This allows suction and feed out of a desired amount of liquid even with the limited bidirectional deformation. Moreover, the inner wall of the supply chamber is partially formed by the tube. This leads to suppression in stagnation and quality degradation of the liquid.

Moreover, it is also preferred that the drive mechanism of the pump apparatus deforms the tube bidirectionally in opposite two directions. This yields a compact configuration of the supply chamber.

Another aspect of the present invention provides a substrate treating apparatus for treating a substrate, the apparatus including a nozzle that dispenses a liquid to the substrate, and a pump apparatus that feeds the liquid to the nozzle. The pump apparatus includes a single supply chamber that passes the liquid, two diaphragms attached to an inner wall of the supply chamber to partially form the inner wall of the supply chamber, and a drive mechanism that performs alternate increase and decrease in volume of the supply chamber by deforming the two diaphragms.

The substrate treating apparatus according to the other aspect of the present invention includes the pump apparatus that feeds the liquid to the nozzle. The drive mechanism of the pump apparatus performs alternate increase and decrease in volume of the supply chamber by deforming the two diaphragms. At this time, the two diaphragms are provided for the single supply chamber. This leads to possibility of suction and feed out of a desired amount of liquid even with the limited deformation of the diaphragms. In addition, the two diaphragms achieve suppressed deformation upon suction and feed out of a desired amount of liquid. This allows selection of the diaphragms each with a short stroke, yielding suppressed stagnation and quality degradation of the liquid.

Another aspect of the present invention provides a substrate treating apparatus for treating a substrate. The substrate treating apparatus includes a nozzle that dispenses a liquid to the substrate, and a pump apparatus that feeds the liquid to the nozzle. The pump apparatus includes a single supply chamber that passes the liquid, a single tube attached to an inner wall of the supply chamber to partially form the inner wall of the supply chamber, and a drive mechanism that performs alternate increase and decrease in volume of the supply chamber by deforming the tube bidirectionally.

The substrate treating apparatus according to the other aspect of the present invention includes the pump apparatus that feeds the liquid to the nozzle. The drive mechanism of the pump apparatus performs alternate increase and decrease in volume of the supply chamber by deforming the tube bidirectionally. At this time, the single tube is deformed bidirectionally. This allows suction and feed out of a desired amount of liquid even with the limited bidirectional deformation. Moreover, the inner wall of the supply chamber is partially formed by the tube. This leads to suppression in stagnation and quality degradation of the liquid.

Advantageous Effects of Invention

The pump apparatus and the substrate treating apparatus according to the present invention achieve suction and feed out of a desired amount of liquid and suppressed quality degradation of the liquid.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

Embodiment 1

Figure 1:
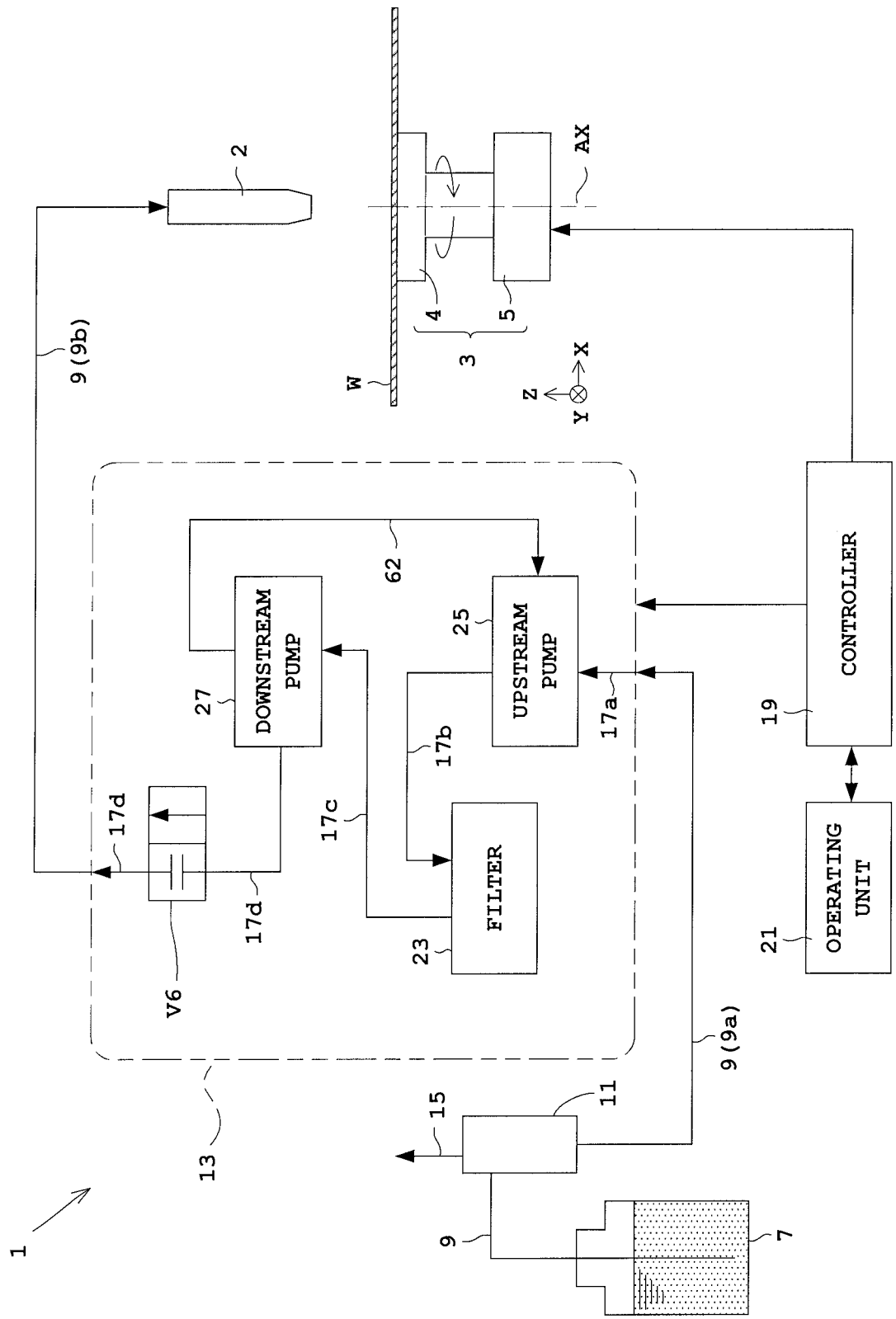
FIG. 1 schematically illustrates a substrate treating apparatus according to Embodiment 1.
Figure 2:
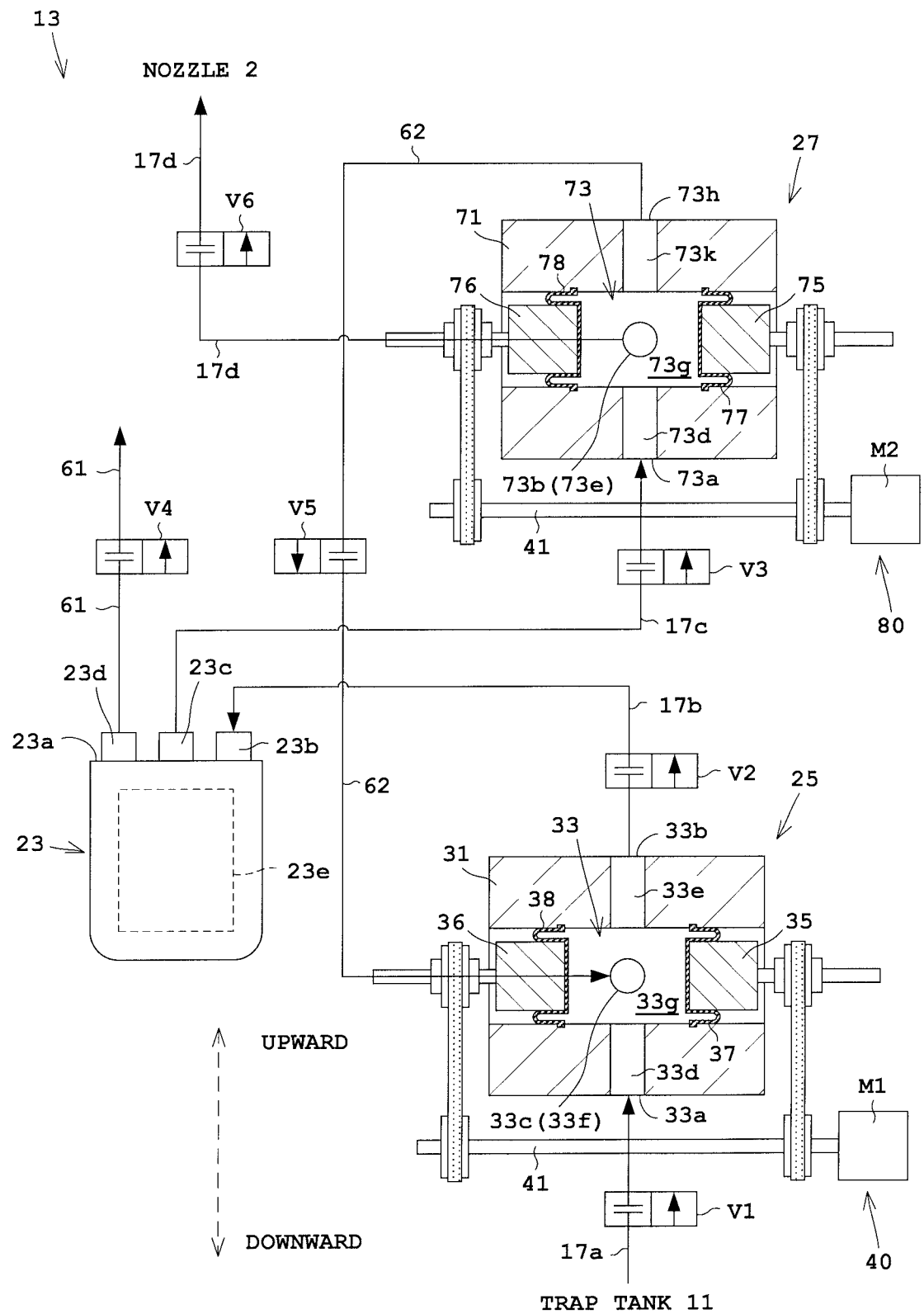
FIG. 2 illustrates a pump apparatus and its height relationship.

The following describes Embodiment 1 of the present invention with reference to drawings. FIG. 1 schematically illustrates a substrate treating apparatus according to Embodiment 1. FIG. 2 illustrates a pump apparatus 13 and its height relationship.

<Configuration of Substrate Treating Apparatus 1>

Reference is made to FIG. 1. A substrate treating apparatus 1 includes a nozzle 2 and a holding rotator 3. The nozzle 2 dispenses a processing liquid to a substrate W. Examples of the processing liquid include a photoresist liquid, a chemical for antireflection film formation, a developing liquid, and a rinse liquid such as solvent or deionized water (DIW). The holding rotator 3 holds the substrate W in a substantially horizontal attitude, and rotates the held substrate W.

The holding rotator 3 includes a spin chuck 4 and a rotational drive unit 5. The spin chuck 4 is rotatably provided around a rotary axis AX for holding the substrate W. For instance, the spin chuck 4 holds the substrate W through vacuum suction of a back side of the substrate W. The rotational drive unit 5 rotates the spin chuck 4 around the rotary axis AX. The rotational drive unit 5 is, for example, formed by an electric motor.

The substrate treating apparatus 1 further includes a processing liquid supplying source 7, a processing liquid pipe 9, a trap tank 11, and a pump apparatus 13. The processing liquid supplying source 7 is formed by a tank, for example, for storing the processing liquid. The processing liquid supplying source 7 supplies the processing liquid though the processing liquid pipe 9 to the nozzle 2. The trap tank 11 and the pump apparatus 13 are interposed in the processing liquid pipe 9 (processing liquid pipes 9a and 9b) in this order from a side adjacent to the processing liquid supplying source 7.

The trap tank 11 temporarily stores the processing liquid for detecting a residual amount of the processing liquid in the processing liquid supplying source 7. The trap tank 11 is provided with an optical residual sensor (not shown). The trap tank 11 is also provided with a drain 15. The drain 15 is a waste liquid line used for discharging air bubbles or the processing liquid containing air bubbles. The drain 15 also has an open/close valve, not shown, provided thereon.

The pump apparatus 13 feeds the processing liquid to the nozzle 2. Within the pump apparatus 13, the processing liquid flows through processing liquid flow path 17a to 17d. The pump apparatus 13 performs feed and stop of the feed of the processing liquid by operation of an open/close valve V6, which is to be mentioned later. The pump apparatus 13 is to be described in detail later.

The substrate treating apparatus 1 further includes a controller 19 and an operating unit 21. The controller 19 is formed by a central processing unit (CPU) and the like. The controller 19 controls elements of the substrate treating apparatus 1 containing the pump apparatus 13. The operating unit 21 includes a display unit, a memory unit, an input unit, and the like. The display unit is formed by a liquid crystal monitor, for example. The memory unit is formed by at least any one of a ROM (Read-Only Memory), a RAM (Random-Access Memory), and a hard disk. The input unit is formed by at least any one of a keyboard, a mouse, and various types of buttons. The memory unit stores various conditions for substrate treatment as well as operational programs needed for control of the substrate treating apparatus 1.

<Configuration of Pump Apparatus 13>

The following describes the pump apparatus 13 with reference to FIG. 2. The pump apparatus 13 includes a filter 23, an upstream pump (also referred to as a fill pump) 25, and a downstream pump (also referred to as a dispense pump) 27. The upstream pump 25 feeds the processing liquid through the filter 23 to the downstream pump 27. The downstream pump 27 dispenses the processing liquid.

The filter 23 is provided between the processing liquid flow path 17b and 17c for passing the processing liquid. The upstream pump 25 is disposed upstream of the filter 23 between the processing liquid flow path 17a and 17b. The downstream pump 27 is disposed downstream of the filter 23 between the processing liquid flow path 17c and 17d.

An open/close valve V1 is interposed in the processing liquid flow path 17a. An open/close valve V2 is interposed in the processing liquid flow path 17b. An open/close valve V3 is interposed in the processing liquid flow path 17c. An open/close valve V4 is interposed in an outlet flow path 61 to be mentioned later. An open/close valve V5 is interposed in a return flow path 62 to be mentioned later. An open/close valve V6 is interposed in the processing liquid flow path 17d. Here, the open/close valves V1 to V6 are not each limited to a normal closed valve, but are formed by a known valve.

The upstream pump 25 includes two pistons 35, 36 and two diaphragms 37, 38 for a single supply chamber 33g. The downstream pump 27 includes two pistons 75, 76 and two diaphragms 77, 78 for a single supply chamber 73g. The following describes in detail the configurations of the filter 23, the upstream pump 25, and the downstream pump 27 in turn.

<Configuration of Filter 23>

Firstly, description is made to the filter 23. The filter 23 is detachable from and attachable to the pump apparatus 13 and is also replaceable. The filter 23 includes an inlet 23b, an outlet 23c, and a vent 23d on its top face 23a. The inlet 23b is connected to the processing liquid flow path 17b. The outlet 23c is connected to the processing liquid flow path 17c. The vent 23d is connected to the outlet flow path 61 through which air bubbles are exhausted. The vent 23d is an outlet for exhausting the air bubbles within the filter 23. This allows the air bubbles to be exhausted in the course of supplying the processing liquid. Here, the vent 23d may exhaust the air bubbles together with the processing liquid. The filter 23 further includes a filter main body 23e. The filter main body 23e actually filters the processing liquid in the filter 23.

<Configuration of Upstream Pump 25>

Figure 3A:
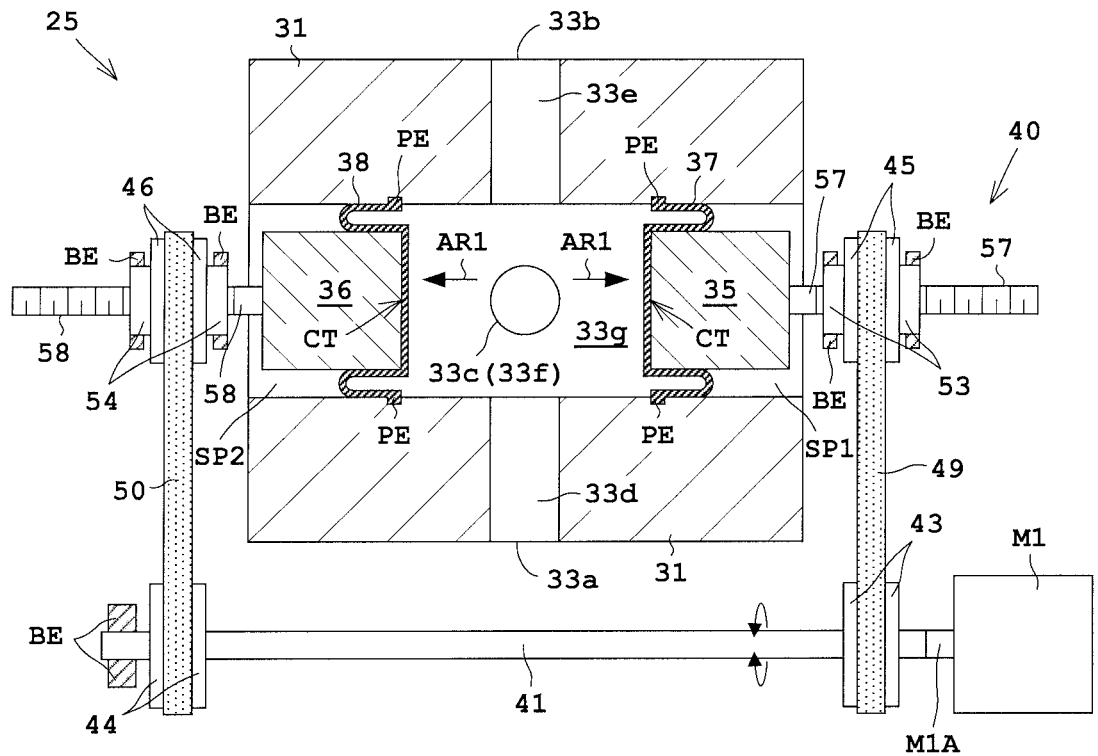
FIGS. 3A and 3B are each a longitudinal sectional view of a configuration and operation of an upstream pump according to the Embodiment 1.
Figure 3B:
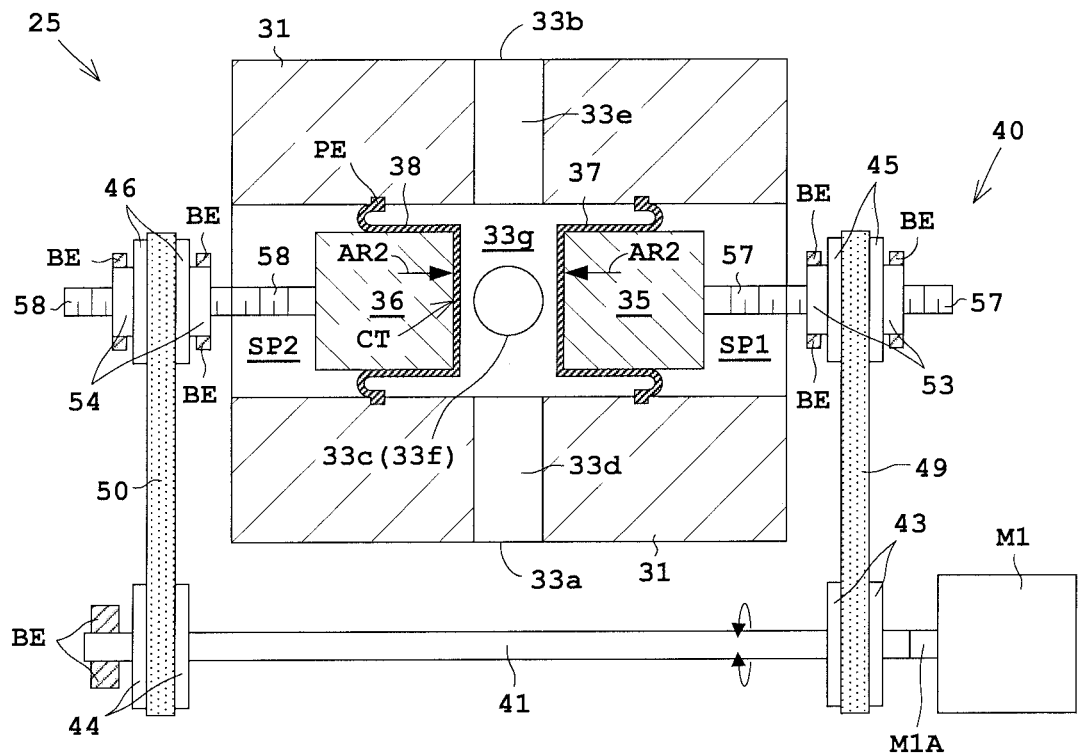

The following describes the upstream pump 25. As illustrated in FIGS. 2, 3A, and 3B, the upstream pump 25 includes a casing (cylinder) 31, an upstream pump flow path 33, two pistons (movable parts) 35, 36, and two diaphragms 37, 38.

Figure 4A:
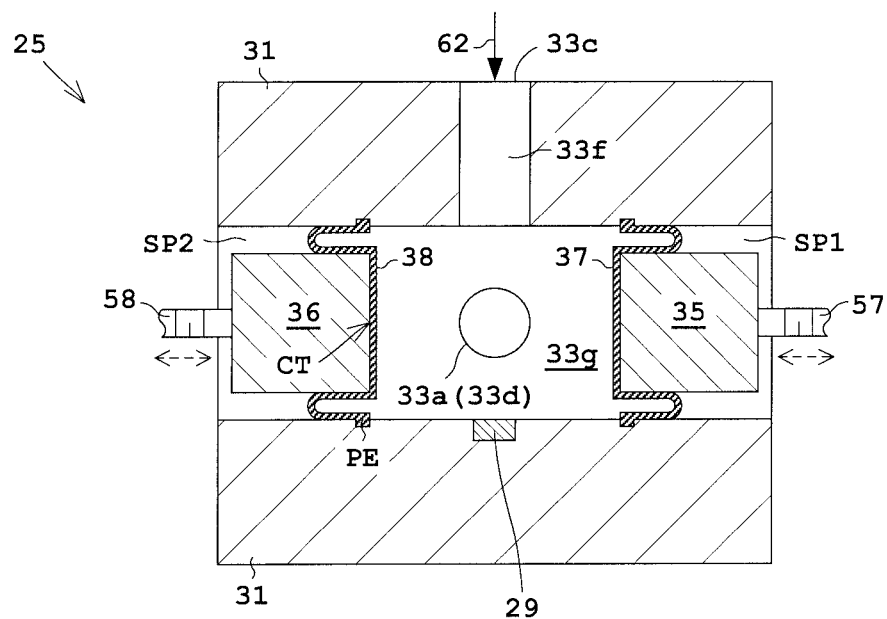
FIG. 4A is a cross sectional view of the upstream pump.

The upstream pump flow path 33 includes an inlet 33a, an outlet 33b, a return inlet 33c, an inlet-side flow path 33d, an outlet-side flow path 33e, a return inlet-side flow path 33f (see FIG. 4A), and a supply chamber 33g. FIG. 4A is a cross sectional view of the upstream pump 25 seen from the above. The processing liquid is sucked from the inlet 33a or the return inlet 33c into the upstream pump 25, and is fed out from the outlet 33b outside of the upstream pump 25. The supply chamber 33g passes the processing liquid. The supply chamber 33g includes an inner wall where a pressure sensor 29 for detecting pressure is provided. The pressure sensor 29 may be provided on the processing liquid flow path 17b, for example, instead of the position in FIG. 4A. As illustrated in FIG. 2, the return inlet 33c is connected to the return flow path 62. Here in FIG. 2, the return flow path 62 overlaps the second piston 36 for convenience of illustration. In other words, the return flow path 62 does not pass through the second piston 36 and the like.

The two pistons 35, 36 are each formed in a cylindrical shape, and reciprocate for variation in volume of the supply chamber 33g. As illustrated in FIG. 3A, the two pistons 35, 36 have flexible diaphragms 37, 38 attached thereto, respectively. That is, the first diaphragm 37 is attached to the first piston 35, and the second diaphragm 38 is attached to the second piston 36. The two diaphragms 37, 38 (or the two pistons 35, 36) face each other across the supply chamber 33g. This yields suppression of the enlarged supply chamber 33g caused by increase in area of the currently-used single diaphragm, leading a more compact configuration of the supply chamber 33g.

The two diaphragms 37, 38 are attached to the inner wall of the supply chamber 33g to form a portion of the inner wall of the supply chamber 33g. Specifically, a periphery PE of the first diaphragm 37 is fixed on the inner wall of the supply chamber 33g (casing 31), and a center part CT of the first diaphragm 37 is fixed on the first piston 35. Likewise, a periphery PE of the second diaphragm 38 is fixed on the inner wall of the supply chamber 33g, and a center part CT of the second diaphragm 38 is fixed on the first piston 35. Moreover, the first diaphragm 37 performs division between the supply chamber 33g and a space SP1 adjacent to a rear face of the first piston 35. The second diaphragm 38 performs division between the supply chamber 33g and a space SP2 adjacent to a rear face of the second piston 36.

In FIG. 3A, the drive mechanism 40 moves the two pistons 35, 36 to deform the two diaphragms 37, 38. This achieves alternate increase and decrease in volume of the supply chamber 33g. Here, each of the increase and decrease may contain a plurality of steps (e.g., two steps). The drive mechanism 40 includes an electric motor (hereinafter, referred to as a "motor" appropriately) M1, a first shaft 41, four pulleys 43 to 46, two belts 49, 50, two nuts 53, 54, two screw shafts 57, 58, two pistons 35, 36, and a bearing BE. The motor M1 is formed by a servomotor or a stepping motor, for example. Here, the two pistons 35, 36 are not necessarily included in the drive mechanism 40.

The motor M1 has an output shaft M1A connected to first shaft 41. The first pulley 43 and the second pulley 44 are fixed to the first shaft 41. The first belt 49 is suspended over the first pulley 43 and the third pulley 45. The second belt 50 is suspended over the second pulley 44 and the fourth pulley 46. The first nut 53 is fixed to the third pulley 45. The second nut 54 is fixed to the fourth pulley 46.

The first nut 53 engages the first screw shaft 57. A first end of the first screw shaft 57 is fixed to the first piston 35. The second nut 54 engages the second screw shaft 58. A first end of the second screw shaft 58 is fixed on the second piston 36.

A guide, not shown, causes the two screw shafts 57, 58 not to rotate around an axis, but to be guided so as to be movable linearly along the axis. The bearing BE rotatably holds the first shaft 41 and the like.

The following describes operation of the drive mechanism 40. The motor M1 rotates. This rotation causes the first shaft 41, the first pulley 43, and the second pulley 44 to rotate. The rotation of the first pulley 43 is transmitted to the third pulley 45 and the first nut 53 via the first belt 49. On the other hand, the rotation of the second pulley 44 is transmitted to the fourth pulley 46 and the second nut 54 via the second belt 50.

Since the first nut 53 engages the first screw shaft 57, the rotation of the first nut 53 is converted into linear movement of the first screw shaft 57. This achieves linear movement of the first piston 35. On the other hand, since the second nut 54 engages the second screw shaft 58, the rotation of the second nut 54 is converted into linear movement of the second screw shaft 58. This achieves linear movement of the second piston 36.

Reference is made to FIG. 3A. When the motor M1 rotates in a given direction, the two diaphragms 37, 38 are deformed simultaneously in a direction where they are away from each other. This yields an increased volume of the supply chamber 33g. It should be noted that the rotation in the given direction is hereinafter referred to as forward rotation. Reference is made to FIG. 3B. When the motor M1 rotates in a direction opposite to the given direction, the two diaphragms 37, 38 are deformed simultaneously in a direction close to each other. This yields a decreased volume of the supply chamber 33g. It should also be noted that the rotation in the direction opposite to the given direction is hereinafter referred to as backward rotation.

Figure 5A:
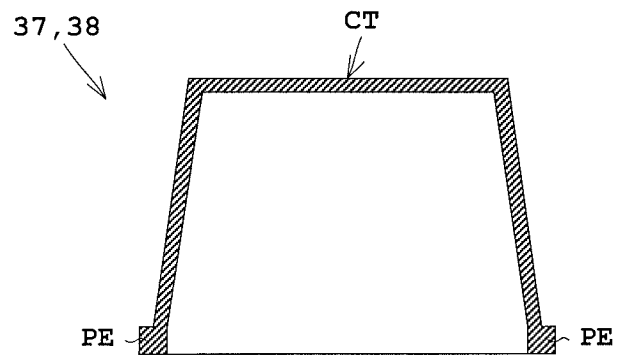
FIGS. 5A and 5B are each a sectional view of one example of a diaphragm.
Figure 5B:
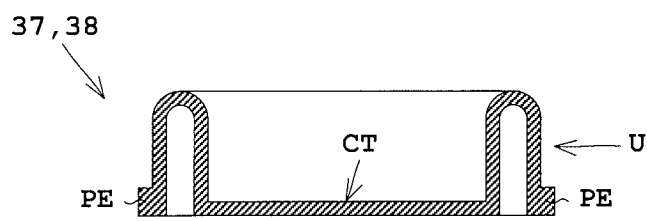

The following describes the two diaphragms 37, 38. FIGS. 5A and 5B are each one example of the diaphragms 37, 38. Each of the two diaphragms 37, 38 is formed by a rolling diaphragm, for example. FIG. 5A illustrates a rolling diaphragm in a top hat shape. When this rolling diaphragm is attached to the upstream pump 25, a folded part in a U-shape is formed as in FIG. 3A. The rolling diaphragm is moved in such a manner that curved portions of the U-shaped folded part (see the numeral CP in FIG. 6) roll along with the movement of the pistons 35, 36. Upon the movement of the curved portions, the first diaphragm 37 is moved away from the side face of the first piston 35 to start contacting the inner wall of the casing 31 or is moved away from the inner wall of the casing 31 to start contacting the side face of the first piston 35. FIG. 5B illustrates the diaphragm having the U-shaped folded part U pre-formed while not attached. In this embodiment, the diaphragm in FIG. 5B is considered one example of the rolling diaphragm if the curved portions of the U-shaped folded part are rollingly moved in the same manner as the diaphragm in FIG. 5A.

FIG. 3A illustrates the upstream pump 25 whose diaphragms 37, 38 are each formed by the rolling diaphragm. Since the two diaphragms 37, 38 are provided, deformation of the diaphragms 37, 38 is each suppressed when a given amount of liquid is sucked and fed out. Accordingly, the rolling diaphragms 37, 38 having folded parts U with a less depth are selectable. This suppresses stagnation and degradation in quality of the liquid.

<Configuration of Downstream Pump 27>

The following describes the downstream pump 27. The downstream pump 27 has a configuration substantially same as the upstream pump 25. Consequently, the description of the common elements is partially omitted. As illustrated in FIG. 2, the downstream pump 27 includes a casing (cylinder) 71, a downstream pump flow path 73, two pistons 75, 76, and two diaphragms 77, 78. Here in FIG. 2, the processing liquid flow path 17d overlaps the fourth piston 76 for convenience of illustration. In other words, the processing liquid flow path 17d does not pass through the fourth piston 76 and the like.

Figure 4B:
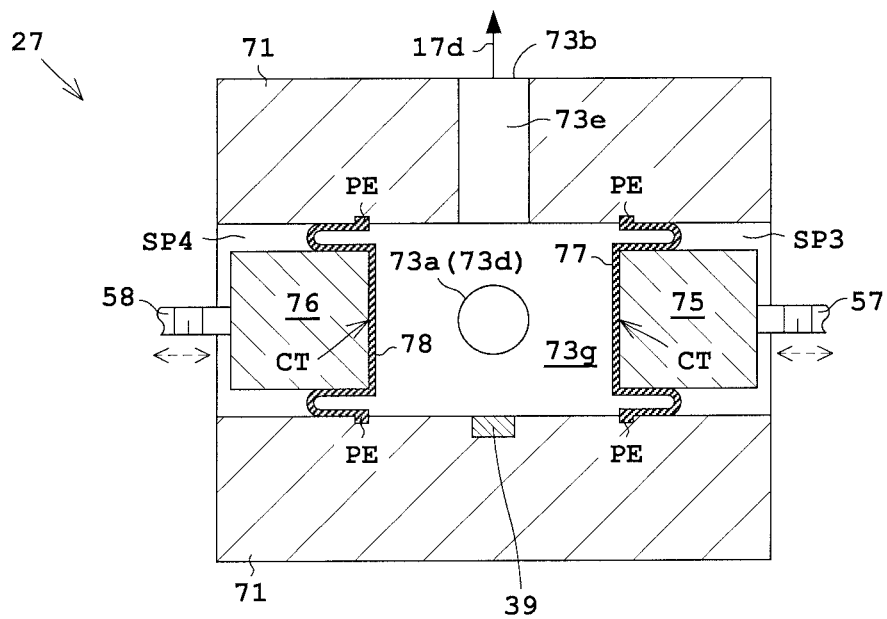
FIG. 4B is a cross sectional view of a downstream pump.

The downstream pump flow path 73 includes an inlet 73a, a supply outlet 73b, an inlet-side flow path 73d, an outlet-side flow path 73e (see FIG. 4B), a supply chamber 73g, a return outlet 73h, and a return outlet-side flow path 73k. The return outlet 73h is connected to the return flow path 62. FIG. 4B is a cross sectional view of the downstream pump 27 seen from the above. The supply chamber 33g includes an inner wall where a pressure sensor 39 for detecting pressure is provided. The pressure sensor 39 may be provided on the processing liquid flow path 17d, for example, instead of the position in FIG. 4B.

The two pistons 75, 76 are each formed in a cylindrical shape, and reciprocate for variation in volume of the supply chamber 73g. As illustrated in FIG. 2, the two pistons 75, 76 have flexible diaphragms 77, 78 attached thereto, respectively. That is, the third diaphragm 77 is attached to the third piston 75, and the fourth diaphragm 78 is attached to the fourth piston 76. The two pistons 35, 36 and the two diaphragms 77, 37 face each other as in FIG. 2.

The two diaphragms 77, 78 are attached to the inner wall of the supply chamber 73g to form a portion of the inner wall of the supply chamber 73g. Specifically, a periphery PE of the third diaphragm 77 is fixed to the inner wall of the supply chamber 73g (casing 71), and a center part CT of the third diaphragm 77 is fixed to the third piston 75. Likewise, a periphery PE of the fourth diaphragm 78 is fixed to the inner wall of the supply chamber 73g, and a center part CT of the fourth diaphragm 78 is fixed on the fourth piston 76. Moreover, as illustrated in FIG. 4B, the third diaphragm 77 performs division between the supply chamber 73g and a space SP3 adjacent to a rear face of the third piston 75. The fourth diaphragm 78 performs division between the supply chamber 73g and a space SP4 adjacent to a rear face of the fourth piston 76.

In FIG. 2, the drive mechanism 80 moves the two pistons 75, 76 to deform the two diaphragms 77, 78, respectively. This yields alternate increase and decrease in volume of the supply chamber 73g. The drive mechanism 80 has a configuration same as the drive mechanism 40 of the upstream pump 25, and thus its description is to be omitted. The drive mechanism 80 includes a motor M2 formed by a servomotor, a stepping motor, or the like. In the drive mechanism 80, the elements other than the motor M2 are denoted by numerals same as that in the drive mechanism 40.

The pump apparatus 13 feeds the processing liquid upwardly from the downward. This achieves the configuration of the pump apparatus 13 in which air bubbles in the processing liquid are unlikely to remain. For instance, the inlet 23b of the filter 23 is disposed higher in level than the outlet 33b of the upstream pump 25. In addition, the inlet 73a of the downstream pump 27 is disposed higher in level than the outlet 23c of the filter 23. On the other hand, the return outlet 73h of the downstream pump 27 is disposed higher in level than the supply outlet 73b. Accordingly, this allows the air bubbles to return back from the return outlet 73h of the downstream pump 27 to the upstream pump 25.

<Operation of Substrate Treating Apparatus 1>

The following describes operation of the substrate treating apparatus 1. A substrate transport mechanism, not shown, transports the substrate W on a holding rotator 3 illustrated in FIG. 1. The holding rotator 3 suction-holds a back side of the substrate W. Then, a nozzle moving mechanism, not shown, moves the nozzle 2 from a standby position outside the substrate W to a dispensation position above the substrate W.

After the nozzle 2 is moved, the controller 19 performs control to open the open/close valve V6 along with operation of the pump apparatus 13 while the substrate W rotates or stops rotating. This causes the nozzle 2 to dispense the processing liquid to the substrate W. The processing liquid within the processing liquid supplying source 7 is fed out to the nozzle 2 via the processing liquid pipe 9. In this course, the processing liquid passes through the trap tank 11 and the pump apparatus 13. After the substrate is treated, the nozzle moving mechanism moves the nozzle 2 from the dispensation position above the substrate W back to the standby position outside the substrate W. Then the holding rotator 3 releases its holding of the substrate W while the substrate W stops rotating. The substrate transport mechanism transports the substrate W from on the holding rotator 3.

The following describes operation of the pump apparatus 13 with reference to FIG. 2.

<Step S01>

In Step S01, the drive mechanism 40 deforms the two diaphragms 37, 38 in the direction away from each other, thereby increasing the volume of the supply chamber 33g. That is, the first piston 35 is moved to deform the first diaphragm 37. This yields the increased volume of the supply chamber 33g. Simultaneously, the second piston 36 is moved to deform the second diaphragm 38. This yields the increased volume of the supply chamber 33g.

In the Step S01, the open/close valve V1 is opened (ON), whereas the open/close valves V2 to V6 are closed (OFF). Accordingly, the processing liquid is sucked from the processing liquid flow path 17a to the upstream pump flow path 33 via the inlet 33a as illustrated in FIG. 2. Note that the motor M2 of the downstream pump 27 stops rotating in the Step S01.

<Step S02>

In Step S02, the drive mechanism 40 deforms the two diaphragms 37, 38 in the direction close to each other, thereby decreasing the volume of the supply chamber 33g.

In the step S02, the open/close valves V2, V3 are opened, whereas the open/close valves V1, V4 to V6 are closed. Such operation causes the processing liquid to be fed out from the upstream pump flow path 33 to the processing liquid flow path 17b via the outlet 33b. The processing liquid into the processing liquid flow path 17b is then fed to the inlet 23b, the filter main body 23e, and the outlet 23c of the filter 23 in turn, and to the processing liquid flow path 17c. In the filter main body 23e, impurities such as air bubbles are removed. The processing liquid into the processing liquid flow path 17c is fed to the downstream pump flow path 73 via the inlet 73a of the downstream pump 27.

In the Step S02, the motor M2 of the downstream pump 27 performs forward rotation. Accordingly, the drive mechanism 80 of the downstream pump 27 deforms the two diaphragms 77, 78 simultaneously in the direction away from each other, thereby increasing the volume of the supply chamber 73g. The processing liquid is sucked from the processing liquid flow path 17c to the downstream pump flow path 73 via the inlet 73a.

<Step S03>

In Step S03, the processing liquid is successively fed from the upstream pump 25 to the downstream pump 27. That is, the drive mechanism 40 of the upstream pump 25 deforms the two diaphragms 37, 38 in the direction close to each other. Moreover, in the Step S03, the open/close valves V2, V3 are opened, whereas the open/close valves V1, V4 to V6 are closed. Note that the motor M2 of the downstream pump 27 stops rotating in the Step S03.

<Step S04>

In Step S04, the processing liquid is fed out from the return outlet 73h of the downstream pump 27. At this time, the air bubbles around the return outlet 73h are also fed out together. The motor M2 of the downstream pump 27 performs backward rotation at a given amount. That is, the drive mechanism 80 of the downstream pump 27 deforms the two diaphragms 77, 78 in the direction close to each other, thereby decreasing the volume of the supply chamber 73g. Moreover, in the Step S04, the open/close valves V5 and V1 are opened, whereas the open/close valves V2, V4 to V6 are closed. The processing liquid from the return outlet 73h is fed out through the return flow path 62 and the return inlet 33c of the upstream pump 25, in this order, and returns back to the upstream pump flow path 33. Here, the processing liquid back into the upstream pump 25 is then fed back into the filter 23 where the air bubbles are removed. In addition, the motor M1 of the upstream pump 25 stops rotating.

<Step S05>

In Step S05, the processing liquid is successively fed out from the return outlet 73h of the downstream pump 27. At this time, the open/close valves V5, V1 are opened, whereas the open/close valves V2 to V4, V6 are closed. On the other hand, the motor M1 of the upstream pump 25 and the motor M2 of the downstream pump 27 stop rotating.

<Step S06>

In Step S06, the processing liquid is fed out from the downstream pump 27 through the supply outlet 73b. The motor M2 of the downstream pump 27 performs backward rotation. Accordingly, the drive mechanism 80 of the downstream pump 27 further deforms the two diaphragms 77, 78 simultaneously in the direction close to each other. Moreover, in the Step S06, the open/close valve V6 is opened, whereas the open/close valves V1 to V5 are closed. The processing liquid fed out from the downstream pump 27 is dispensed from the nozzle 2 in FIG. 1 through the processing liquid pipe 9b. Note that the motor M1 of the upstream pump 25 stops rotating in the Step S06.

After the Step S06, the process returns to the Step S01, and the Step S01 to S06 are repeatedly performed. The air bubbles may be removed through the filter 23 by draining the processing liquid containing the air bubbles via the outlet flow path 61 at any timing such as when a series of substrate treatment is completed. During removal of the air bubbles through the filter 23, the open/close valves V2, V4 are opened, whereas the open/close valves V1, V3, V5, V6 are closed.

With the present embodiment, the drive mechanism 40 of the upstream pump 25 deforms the two diaphragms 37, 38 simultaneously in the direction away from each other and in the direction close to each other, thereby performing alternate increase/decrease in volume of the supply chamber 33g. At this time, the two diaphragms 37, 38 are provided for the single supply chamber 33g. This allows suction and feed out of a desired amount of liquid even with the limited deformation of the diaphragms 37, 38.

Figure 6:
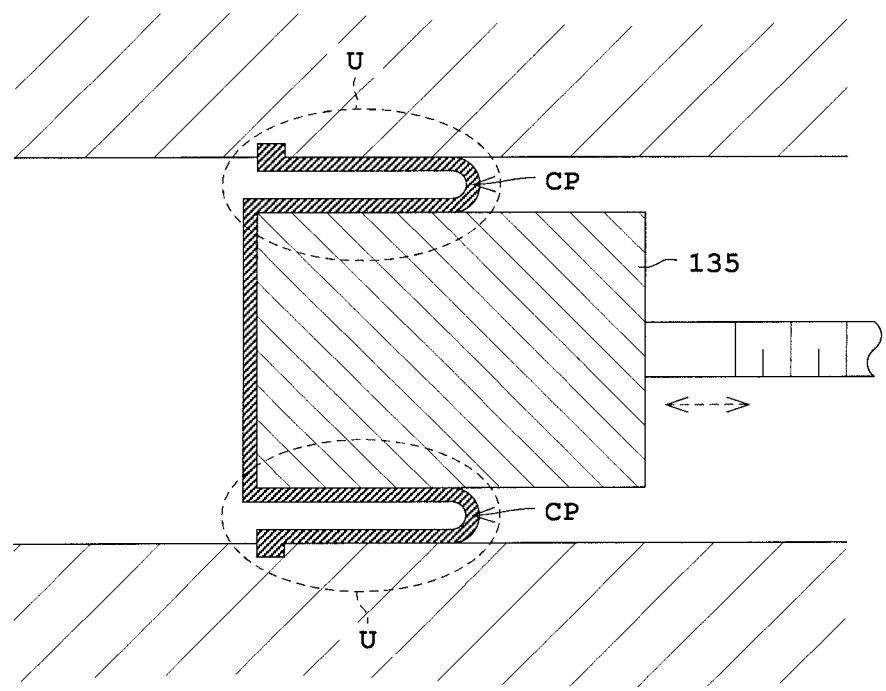
FIG. 6 is a sectional view used for explanation of a currently-used diaphragm.

Moreover, it is assumed as in FIG. 6 that the rolling diaphragm is used for cooperating with the single piston 135 of a currently-used type. Since the rolling diaphragm has a deeply U-shaped folded part U, a long stroke is obtainable. On the other hand, the long stroke requires a deep folded part U. The deeper folded part U causes poor flow of the liquid into a clearance of the folded part U, leading to stagnation of the liquid. Accordingly, there may be the case where some stagnated liquid solidifies as foreign matters, leading to degradation in quality of the liquid. On the other hand, the two diaphragms (rolling diaphragms) 37, 38 are provided, achieving suppressed deformation of the diaphragms 37, 38 upon suction and feed of a given amount of liquid. This allows selection of the diaphragms 37, 38 each with a short stroke, yielding suppressed stagnation and quality degradation of the liquid.

In addition, if one of the two diaphragms 37, 38 is not deformed, the liquid may stagnate in a groove or the folded part of the diaphragm that is not deformed. However, the two diaphragms 37, 38 are deformed simultaneously, leading to flow of the liquid to suppress the stagnation of the liquid.

Embodiment 2

The following describes Embodiment 2 of the present invention with reference to drawings. The description common to that in the Embodiment 1 is to be omitted.

In the Embodiment 1, the two pistons 35, 36 of the upstream pump 25 move to deform the two diaphragms 37, 38 for suction and feed out of the processing liquid. In contrast to this, the Embodiment 2 deforms a single flexible tube (tubephragm) 83 by moving the two pistons 35, 36.

Figure 7:
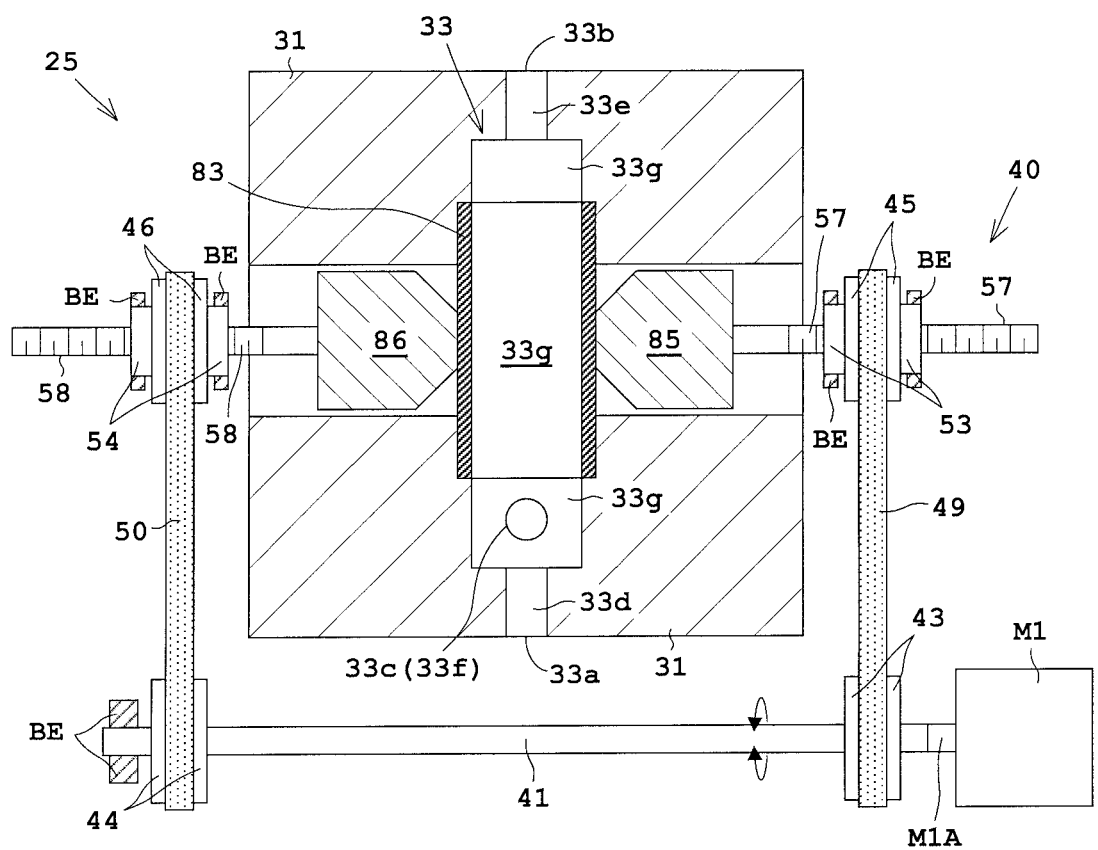
FIG. 7 is a longitudinal sectional view of an upstream pump according to Embodiment 2.

FIG. 7 is a longitudinal sectional view of the upstream pump 25 according to the Embodiment 2. The upstream pump 25 includes a casing 31, an upstream pump flow path 33, a tube 83, and two pistons 85, 86. Likewise the Embodiment 1, the upstream pump flow path 33 includes an inlet 33a, an outlet 33b, a return inlet 33c, an inlet-side flow path 33d, an outlet-side flow path 33e, a return inlet-side flow path 33f, and a supply chamber 33g.

The tube 83 is flexible, and its inner wall has no bellows or irregularity that prevents flow of the processing liquid, and thus its surface is smooth. The tube 83 is attached to an inner wall of the supply chamber 33g to form a portion of the inner wall of the supply chamber 33g. Alternatively, the tube 83 may form the entire supply chamber 33g. The two pistons 85, 86 are each tapered for easy crush of the tube 83. Moreover, the two pistons 85, 86 face to each other across the tube 83 (supply chamber 33g).

Figure 8A:
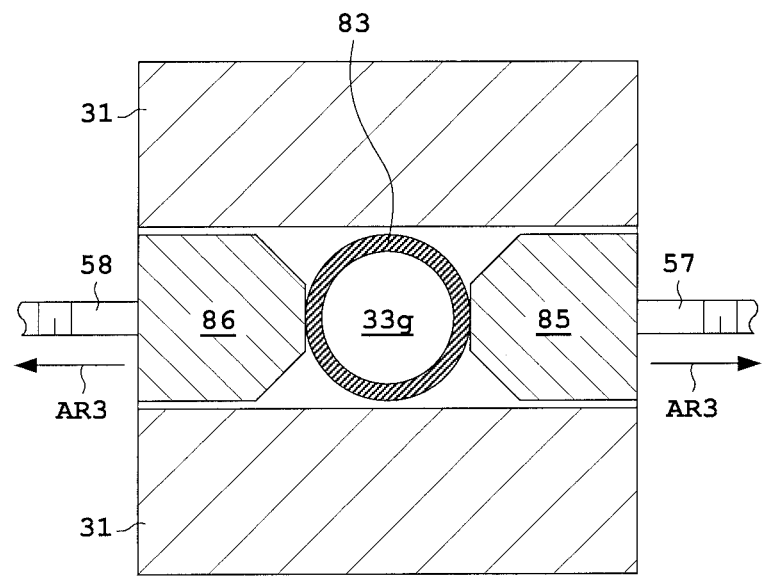
FIGS. 8A and 8B are each a cross sectional view used for explanation of operation of the upstream pump according to the Embodiment 2.
Figure 8B:
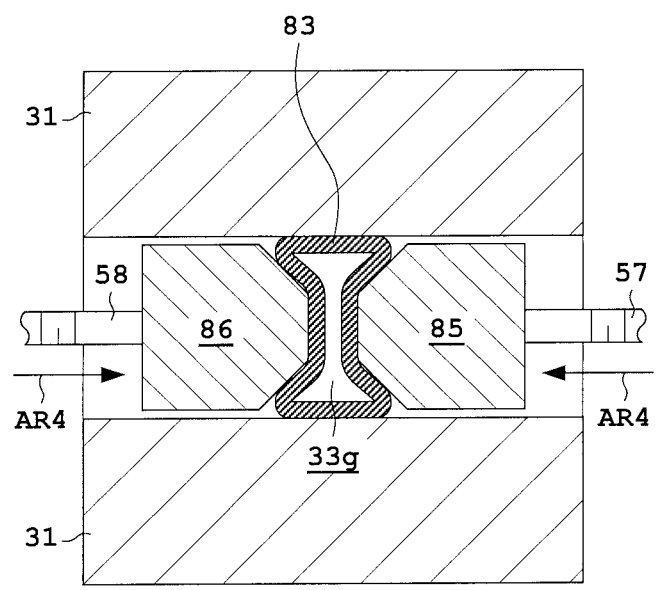

The drive mechanism 40 sandwiches the tube 83 bidirectionally to deform to the tube 83 and perform alternate increase and decrease in volume of the supply chamber 33g. Specifically, the drive mechanism 40 sandwiches the tube 83 bidirectionally as the arrow AR3 in FIG. 8A to deform the tube 83 simultaneously for expansion of the tube 83, thereby increasing the volume of the supply chamber 33g. In other words, the drive mechanism 40 moves the two pistons 85,86 simultaneously in the direction away from each other, thereby deforming (expanding) the tube 83. Accordingly, the volume of the supply chamber 33g increases. In addition, the drive mechanism 40 sandwiches the tube 83 bidirectionally as the arrow AR4 in so as to crush the tube 83, thereby decreasing the volume of the supply chamber 33g. In other words, the drive mechanism 40 moves the two pistons 85, 86 simultaneously in the direction close to each other, thereby deforming (crushing) the tube 83. Accordingly, the volume of the supply chamber 33g decreases. Note that the downstream pump 27 has the same configuration as the upstream pump 25 of the present embodiment.

With the present embodiment, the drive mechanism 40 deforms the tube 83 bidirectionally, thereby performing alternate increase and decrease in volume of the supply chamber 33g. At this time, the tube 83 is deformed bidirectionally. This allows suction and feed out of a desired amount of liquid even with the limited bidirectional deformation. Moreover, the inner wall of the supply chamber 33g is partially formed by the tube 83. This leads to suppression in stagnation and quality degradation of the liquid.

The present invention is not limited to the foregoing examples, but may be modified as follows.

Figure 9A:
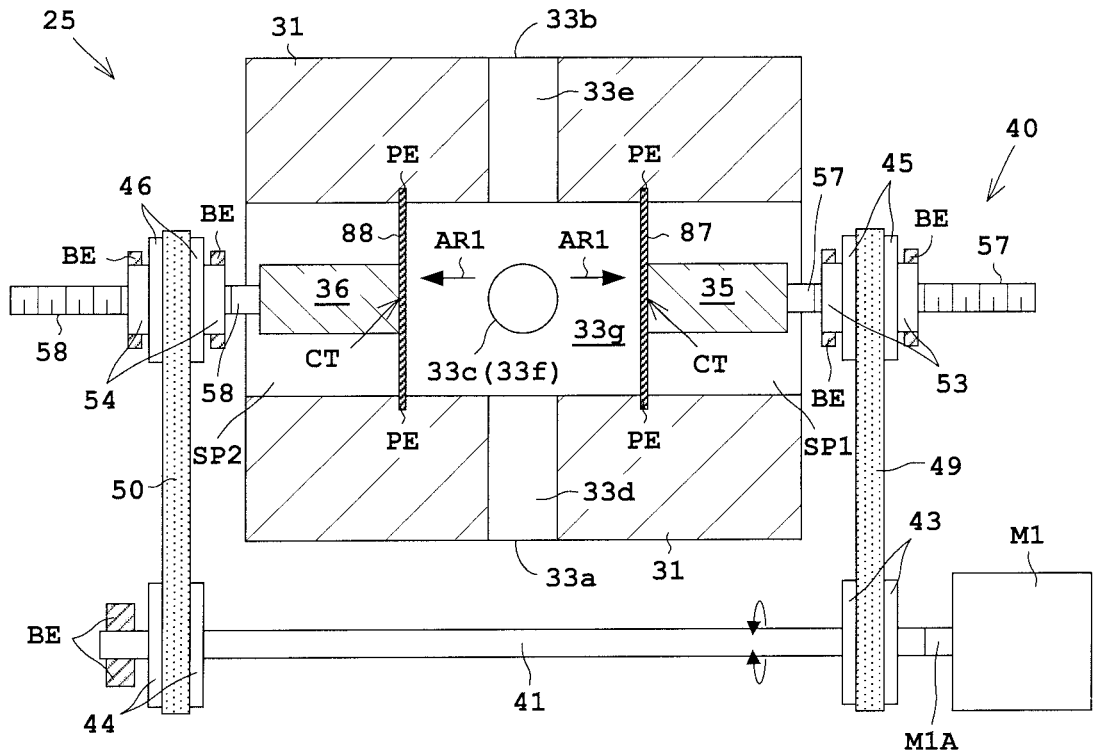
FIGS. 9A and 9B are each a longitudinal sectional view of a configuration and operation of an upstream pump according to one modification.
Figure 9B:
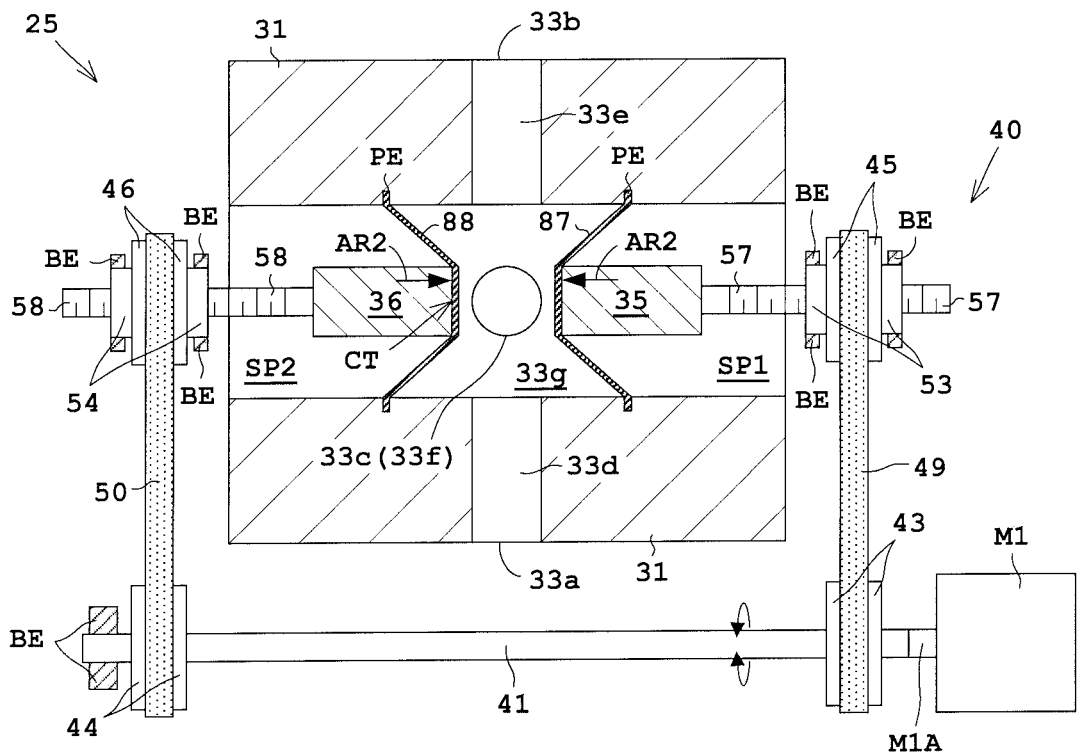

(1) In the Embodiment 1 mentioned above, the diaphragms 37, 38, 77, 78 are each formed by the rolling diaphragm. However, another type of diaphragm is applicable. For instance, the diaphragms 37, 38, 77, 78 may each be formed by a flat diaphragm, a grooved diaphragm (a convoluted diaphragm), a dished diaphragm, and a waveform diaphragm (a corrugated diaphragm). The waveform diaphragm has a plurality of concentric grooves formed thereon. FIGS. 9A and 9B each illustrate the upstream pump 25 whose diaphragms are flat diaphragms 87, 88. The downstream pump 27 has the same configuration as the upstream pump 25. FIG. 9A illustrates a condition in which the two pistons 35, 36 are moved in the direction away from each other. FIG. 9B illustrates a condition in which the two pistons 35, 36 are moved in the direction close to each other.

Figure 10:
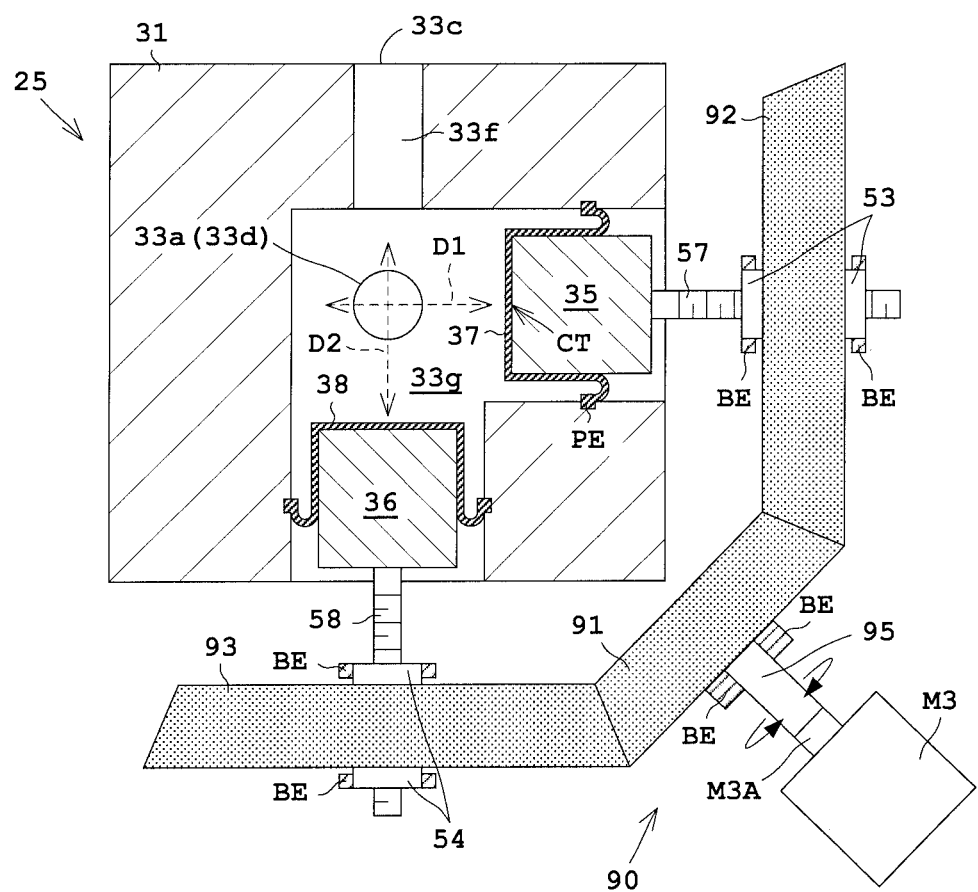
FIG. 10 is a cross sectional view used for explanation of the upstream pump according to the modification.

(2) In the embodiments and the modification (1) mentioned above, the two pistons 35, 36 as well as the two diaphragms 37, 38 face each other across the supply chamber 33g as in the upstream pump 25 of FIG. 2. In contrast to this, the two pistons 35, 36 as well as the two diaphragms 37, 38 may be arranged so as to surround the supply chamber 33g. For instance, the two pistons 35, 36 as well as the two diaphragms 37, 38 may be arranged in such a manner that moving directions D1, D2 of the two pistons 35, 36 are orthogonal to each other. FIG. 10 is a cross sectional view of the upstream pump 25 seen from the top. In FIG. 10, the moving direction D1 of the first piston 35 crosses the moving direction D2 of the second piston 36 by 90 degrees. In this case, no interference occurs between the two pistons 35, 36. In the Embodiment 2, the tube 83 is deformed bidirectionally in two directions opposite to each other (by 180 degrees). Alternatively, the two directions may be 90 degrees such as a relationship between the movement directions D1, D2 in FIGS. 10.

The drive mechanism 90 in FIG. 10 also includes three bevel gears 91 to 93. Rotation of the motor M3 causes rotation of a second shaft 95 connected to an output shaft M3A of the motor M3 and rotation of a first bevel gear 91 fixed to a second shaft 95. Rotation of the first bevel gear 91 causes rotation of a second bevel gear 92 and a third bevel gear 93 engaging the first bevel gear 91. The second bevel gear 92 is fixed to the first nut 53, and the third bevel gear 93 is fixed to the second nut 54.

Accordingly, when the second bevel gear 92 rotates along with the first nut 53, the first nut 53 engages the first screw shaft 57 to move the first screw shaft 57 and the first piston 35. Likewise, when third bevel gear 93 rotates along with the second nut 54, the second nut 54 engages the second screw shaft 58 to move the second screw shaft 58 and the second piston 36. Forward rotation of the motor M3 causes the two pistons 35, 36 to move in the direction away from each other. Backward rotation of the motor M3 causes the two pistons 35, 36 to move in the direction close to each other. Here, the downstream pump 27 has the same configuration as the upstream pump 25.

(3) In the embodiments and the modification (1) mentioned above, the drive mechanisms 40, 80 each include a pulley and a belt as a transmitting part for transmitting the rotation of the motor M. In contrast to this, the drive mechanisms 40, 80 may include a plurality of ball screws and gears for the transmitting part.

(4) In the embodiments and the modifications mentioned above, the drive mechanism 40 includes a single motor M1 for deforming the two diaphragms 37, 38 simultaneously. In contrast to this, the drive mechanism 40 may include two motors M1. Specifically, the motors M1 are disposed on the two piston 35, 36, respectively. One of the motors M1 moves first piston 35, whereas the other motor M1 moves the second piston 36. As illustrated in FIGS. 3A and 3B, the two motors M1 move the two pistons 35, 36 in the directions away from and close to each other. Alternatively, the two motors M1 may move the two pistons 35, 36 individually. Here, when a timing of operation of one piston is shifted, a period of time during which the two diaphragms 37, 38 are deformed simultaneously is decreased, leading to suppressed pulsing of the fluid to be fed out.

(5) In the embodiments and the modifications mentioned above, the two pistons 35, 36 are moved through rotation of the motor M1. In contrast to this, the two pistons 35, 36 may be moved through flowing into/out of gases. Alternatively, the two pistons 35, 36 may be moved by a solenoid.

(6) In the embodiments and the modifications mentioned above, the pump apparatus 13 includes the upstream pump 25 and the downstream pump 27 (i.e., two pumps). In contrast to this, the pump apparatus 13 may be a single pump. Alternatively, either the upstream pump 25 or the downstream pump 27 in the pump apparatus 13 may be a pump with a single position of a currently-used type.

(7) In the embodiments and the modifications mentioned above, the upstream pump 25 and the downstream pump 27 are disposed vertically for achieving easy evacuation of the air bubbles in the processing liquid. However, this is not limitative. For instance, the upstream pump 25 may be disposed higher in level than the downstream pump 27. Alternatively, the upstream pump 25 and the downstream pump 27 may be disposed from side to side.

(8) In the embodiments and the modifications mentioned above, the upstream pump 25 and the downstream pump 27 each include the two pistons. Alternatively, three or more pistons may be provided. That is, the upstream pump 25 and the downstream pump 27 may include two or more (a plurality of) pistons. In this case, two or more diaphragms are to be deformed in the Embodiment 1, and the tube 83 is deformed in three or more directions in the Embodiment 2.

The present invention may be embodied in other specific forms without departing from the spirit or essential attributes thereof and, accordingly, reference should be made to the appended claims, rather than to the foregoing specification, as indicating the scope of the invention.

What is claimed is:

1. A pump apparatus for feeding a liquid, comprising:
   a filter configured to filter the liquid;
   an upstream pump that is disposed upstream of the filter; and
   a downstream pump that is disposed downstream of the filter;
   each of the upstream pump and the downstream pump comprising:
      a single supply chamber that is disposed in a casing and passes the liquid;
      a first opening, a second opening, and a third opening that are each disposed in the casing and configured to pass the liquid;
      a first rolling diaphragm and a second rolling diaphragm attached to an inner wall of the supply chamber to partially form the inner wall of the supply chamber;
      a first movable part that is fixed on a center part of the first rolling diaphragm and is disposed outside of the supply chamber, the first movable part reciprocating on a first path in the casing;
      a second movable part that is fixed on a center part of the second rolling diaphragm and is disposed outside of the supply chamber, the second movable part reciprocating on a second path in the casing; and
      a drive mechanism that deforms the first rolling diaphragm and the second rolling diaphragm by moving the first movable part and the second movable part to perform alternate increase and decrease in volume of the supply chamber;
   the first rolling diaphragm including a folded part that is disposed at a clearance between the first movable part and an inner wall of the first path in the casing,
   the second rolling diaphragm including a folded part that is disposed at a clearance between the second movable part and an inner wall of the second path in the casing,
   the second opening is connected to the supply chamber above the third opening, and
   the first opening is connected to the supply chamber below the third opening, the pump apparatus further comprising:
   a first liquid flow path that is connected to the first opening on a lower side of the upstream pump and is configured to feed the liquid into the supply chamber in the upstream pump;
   a second liquid flow path that is connected to the second opening on an upper side of the upstream pump and is configured to feed the liquid within the supply chamber in the upstream pump to the filter;
   a third liquid flow path that is connected to the first opening on a lower side of the downstream pump and is configured to feed the liquid from the filter into the supply chamber in the downstream pump;
   a fourth liquid flow path that is connected to the third opening in the downstream pump and is configured to feed out the liquid within the supply chamber in the downstream pump; and
   a return flow path that is connected to the second opening on an upper side of the downstream pump and the third opening in the upstream pump and is configured to return the liquid from the second opening on the upper side of the downstream pump to the third opening in the upstream pump.

2. The pump apparatus according to claim 1, wherein
   the drive mechanism of the upstream pump performs the alternate increase and decrease in volume of the supply chamber of the upstream pump, the increase being made by deforming the first rolling diaphragm of the upstream pump and the second rolling diaphragm of the upstream pump in a first direction away from each other, and the decrease being made by deforming the first rolling diaphragm of the upstream pump and the second rolling diaphragm of the upstream pump in a second direction close to each other, and
   the drive mechanism of the downstream pump performs the alternate increase and decrease in volume of the supply chamber of the downstream pump, the increase being made by deforming the first rolling diaphragm of the downstream pump and the second rolling diaphragm of the downstream pump in a first direction away from each other, and the decrease being made by deforming the first rolling diaphragm of the downstream pump and the second rolling diaphragm of the downstream pump in a second direction close to each other.

3. The pump apparatus according to claim 1, wherein
the first rolling diaphragm of the upstream pump and the second rolling diaphragm of the upstream pump are disposed to face each other across the supply chamber of the upstream pump, and
the first rolling diaphragm of the downstream pump and the second rolling diaphragm of the downstream pump are disposed to face each other across the supply chamber of the downstream pump.

4. A substrate treating apparatus for treating a substrate, the substrate treating apparatus comprising:
a nozzle that dispenses a liquid to the substrate; and
a pump apparatus that feeds the liquid to the nozzle, the pump apparatus comprising:
a filter configured to filter the liquid;
an upstream pump that is disposed upstream of the filter; and
a downstream pump that is disposed downstream of the filter;
each of the upstream pump and the downstream pump comprising:
a single supply chamber that is disposed in a casing and passes the liquid;
a first opening, a second opening, and a third opening that are each disposed in the casing and configured to pass the liquid;
a first rolling diaphragm and a second rolling diaphragm attached to an inner wall of the supply chamber to partially form the inner wall of the supply chamber;
a first movable part that is fixed on a center part of the first rolling diaphragm and is disposed outside of the supply chamber, the first movable part reciprocating on a first path in the casing;
a second movable part that is fixed on a center part of the second rolling diaphragm and is disposed outside of the supply chamber, the second movable part reciprocating on a second path in the casing; and
a drive mechanism that deforms the first rolling diaphragm and the second rolling diaphragm by moving the first movable part and the second movable part to perform alternate increase and decrease in volume of the supply chamber;
the first rolling diaphragm including a folded part that is disposed at a clearance between the first movable part and an inner wall of the first path in the casing,
the second rolling diaphragm including a folded part that is disposed at a clearance between the second movable part and an inner wall of the second path in the casing,
the second opening is connected to the supply chamber above the third opening, and
the first opening is connected to the supply chamber below the third opening, the pump apparatus further comprising:
a first liquid flow path that is connected to the first opening on a lower side of the upstream pump and is configured to feed the liquid into the supply chamber in the upstream pump;
a second liquid flow path that is connected to the second opening on an upper side of the upstream pump and is configured to feed the liquid within the supply chamber in the upstream pump to the filter;
a third liquid flow path that is connected to the first opening on a lower side of the downstream pump and is configured to feed the liquid from the filter into the supply chamber in the downstream pump;
a fourth liquid flow path that is connected to the third opening in the downstream pump and is configured to feed out the liquid within the supply chamber in the downstream pump; and
a return flow path that is connected to the second opening on an upper side of the downstream pump and the third opening in the upstream pump and is configured to return the liquid from the second opening on the upper side of the downstream pump to the third opening in the upstream pump.

\* \* \* \* \*